(12) United States Patent
Choi et al.

(10) Patent No.: US 12,456,633 B2
(45) Date of Patent: Oct. 28, 2025

(54) WAFER CLEANING EQUIPMENT

(71) Applicant: SAMSUNG ELECTRONICS CO., LTD., Suwon-si (KR)

(72) Inventors: Yunseok Choi, Suwon-si (KR); Eunseok Lee, Suwon-si (KR); Seungri Ju, Suwon-si (KR); Yungjun Kim, Gyeonggi-do (KR); Jaehyun Sung, Suwon-si (KR); Yongkyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 302 days.

(21) Appl. No.: 18/296,336

(22) Filed: Apr. 5, 2023

(65) Prior Publication Data
US 2024/0006195 A1 Jan. 4, 2024

(30) Foreign Application Priority Data

Jun. 29, 2022 (KR) .................. 10-2022-0079998

(51) Int. Cl.
*H01L 21/67* (2006.01)
*B08B 3/02* (2006.01)
(Continued)

(52) U.S. Cl.
CPC .......... *H01L 21/67051* (2013.01); *B08B 3/02* (2013.01); *B08B 3/12* (2013.01);
(Continued)

(58) Field of Classification Search
CPC ......... H01L 21/67051; H01L 21/02057; H01L 21/67057; H01L 21/68728; H01L 21/68764; B08B 3/02; B08B 3/12
See application file for complete search history.

(56) References Cited

U.S. PATENT DOCUMENTS 6,492,308 B1 12/2002 Naghshineh et al.
6,546,939 B1 4/2003 Small
(Continued)

FOREIGN PATENT DOCUMENTS

CN 1433567 7/2003
CN 1675028 A 9/2005
(Continued)

OTHER PUBLICATIONS

KR20130076714 translation (Year: 2013).*
KR20100052827 translation (Year: 2010).*

*Primary Examiner* — Michael E Barr
*Assistant Examiner* — Lauren G Orta
(74) *Attorney, Agent, or Firm* — Morgan, Lewis & Bockius LLP

(57) ABSTRACT

A wafer cleaning equipment includes a vessel that includes a first inner wall, a second inner wall that faces the first inner wall, and a bottom connected to the first and second inner walls, a plurality of first nozzles disposed on the first inner wall, a plurality of second nozzles disposed on the second inner wall, a support structure disposed between the plurality of first nozzles and the plurality of second nozzles, where the support structure supports a wafer, and a megasonic cleaner disposed between the bottom of the vessel and the wafer supported by the support structure. The megasonic cleaner includes a rack and at least one vibrator disposed below the rack.

20 Claims, 21 Drawing Sheets

(51) Int. Cl.
*B08B 3/12* (2006.01)
*H01L 21/02* (2006.01)
*H01L 21/687* (2006.01)

(52) U.S. Cl.
CPC .. *H01L 21/02057* (2013.01); *H01L 21/67057* (2013.01); *H01L 21/68728* (2013.01)

(56) References Cited

U.S. PATENT DOCUMENTS

| | | |
|---|---|---|
| 6,723,691 B2 | 4/2004 | Naghshineh et al. |
| 7,743,449 B2 * | 6/2010 | Mikhaylichenko ....... B08B 1/32 15/77 |
| 8,765,653 B2 | 7/2014 | Tamboli et al. |
| 9,610,615 B2 | 4/2017 | Tien et al. |
| 10,879,086 B2 | 12/2020 | Sakurai et al. |
| 2004/0029494 A1 | 2/2004 | Banerjee et al. |
| 2004/0216764 A1 | 11/2004 | Mikhaylich et al. |
| 2013/0056041 A1 * | 3/2013 | Yin .................. H01L 21/67086 134/184 |
| 2013/0111678 A1 | 5/2013 | Chen et al. |
| 2018/0001440 A1 * | 1/2018 | Aono ................ H01L 21/67028 |
| 2019/0006204 A1 | 1/2019 | Wei et al. |
| 2021/0339428 A1 * | 11/2021 | Qiu ........................ B23K 26/53 |

FOREIGN PATENT DOCUMENTS

| | | | | |
|---|---|---|---|---|
| CN | 106191887 | | 12/2016 | |
| CN | 111014169 A | * | 4/2020 | ............. B08B 13/00 |
| GN | 1822327 | | 8/2006 | |
| JP | 5749457 | | 7/2015 | |
| KR | 10-0680408 | | 2/2007 | |
| KR | 10-0831180 | | 5/2008 | |
| KR | 20100052827 A | * | 5/2010 | |
| KR | 20130076714 A | * | 7/2013 | |

* cited by examiner

WAFER CLEANING EQUIPMENT

CROSS-REFERENCE TO RELATED APPLICATION

This application claims priority under 35 U.S.C. § 119 from Korean Patent Application No. 10-2022-0079998, filed on Jun. 29, 2022 in the Korean Intellectual Property Office, the contents of which are herein incorporated by reference in their entirety.

TECHNICAL FIELD

Embodiments of the inventive concept are directed to wafer cleaning equipment that cleans a wafer after chemical mechanical planarization (CMP), and more particularly, to wafer cleaning equipment that increases a cleaning effect by combining a megasonic cleaner with a nozzle spraying fluid that is a mixture of $N_2$ and distilled water.

DISCUSSION OF THE RELATED ART

After CMP is performed on a wafer, the wafer is usually cleaned to remove undesirable residue and particles from the wafer. For example, slurry, residue of a polished wafer, or other residue may adhere to the wafer including an edge bezel.

After CMP, wafers may be cleaned to remove undesirable material from the wafers. Wafers may be transferred to a cleaning module, such as a megasonic tank. However, as new kinds of slurry have recently been used for CMP, current techniques for separating particles from wafers using vibration in a megasonic tank have decreased effectiveness.

SUMMARY

Embodiments of the inventive concept provide wafer cleaning equipment that increases a cleaning effect on a wafer.

According to an embodiment of the inventive concept, there is provided a wafer cleaning equipment that includes a vessel that includes a first inner wall, a second inner wall that faces the first inner wall, and a bottom connected to the first and second inner walls, a plurality of first nozzles disposed on the first inner wall, a plurality of second nozzles disposed on the second inner wall, a support structure disposed between the plurality of first nozzles and the plurality of second nozzles, where the support structure is configured to support a wafer, and a megasonic cleaner disposed between the bottom of the vessel and the wafer supported by the support structure. The megasonic cleaner includes a rack and at least one vibrator disposed below the rack.

According to another embodiment of the inventive concept, there is provided a wafer cleaning equipment that includes a vessel that includes a first inner wall, a second inner wall that faces the first inner wall, and a bottom connected to the first and second inner walls, a first megasonic cleaner disposed on the first inner wall, a second megasonic cleaner disposed on the second inner wall, a plurality of first nozzles disposed on the first inner wall and above the first megasonic cleaner, a plurality of second nozzles disposed on the second inner wall and above the second megasonic cleaner, a support structure disposed between the plurality of first nozzles and the plurality of second nozzles, where the support structure is configured to support a wafer, and a third megasonic cleaner disposed between the bottom of the vessel and the wafer supported by the support structure. The third megasonic cleaner includes a rack and at least one vibrator disposed below the rack.

According to a further embodiment of the inventive concept, there is provided a wafer cleaning equipment that includes a vessel that includes a first inner wall, a second inner wall that faces the first inner wall, and a bottom connected to the first and second inner walls, a plurality of first nozzles disposed on the first inner wall, where the plurality of first nozzles are aimed at a main surface of a wafer, a plurality of second nozzles disposed on the second inner wall, where the plurality of second nozzles are aimed at a bottom surface of the wafer and are symmetrically disposed with the plurality of first nozzles with respect to the wafer, a support structure disposed between the plurality of first nozzles and the plurality of second nozzles, where the support structure is configured to support the wafer, and a megasonic cleaner disposed between the bottom of the vessel and the wafer supported by the support structure, where the megasonic cleaner includes a rack and at least one vibrator disposed below the rack. The rack is inclined at a predetermined angle with respect to a virtual plane parallel with the bottom of the vessel, and the at least one vibrator transmits energy to a cleaning solution flowing on a top surface of the rack as waves. The support structure includes a plurality of lower supports coupled to a lower portion of the wafer and that support the wafer, each of the plurality of lower supports is connected to a motor that rotates the wafer, and a plurality of upper supports coupled to an upper portion of the wafer and that integrally rotate with the wafer. The plurality of upper supports are respectively connected to a plurality of arms that move in a direction parallel with the bottom of the vessel and in a direction perpendicular to the bottom of the vessel.

DETAILED DESCRIPTION

Figure 1:
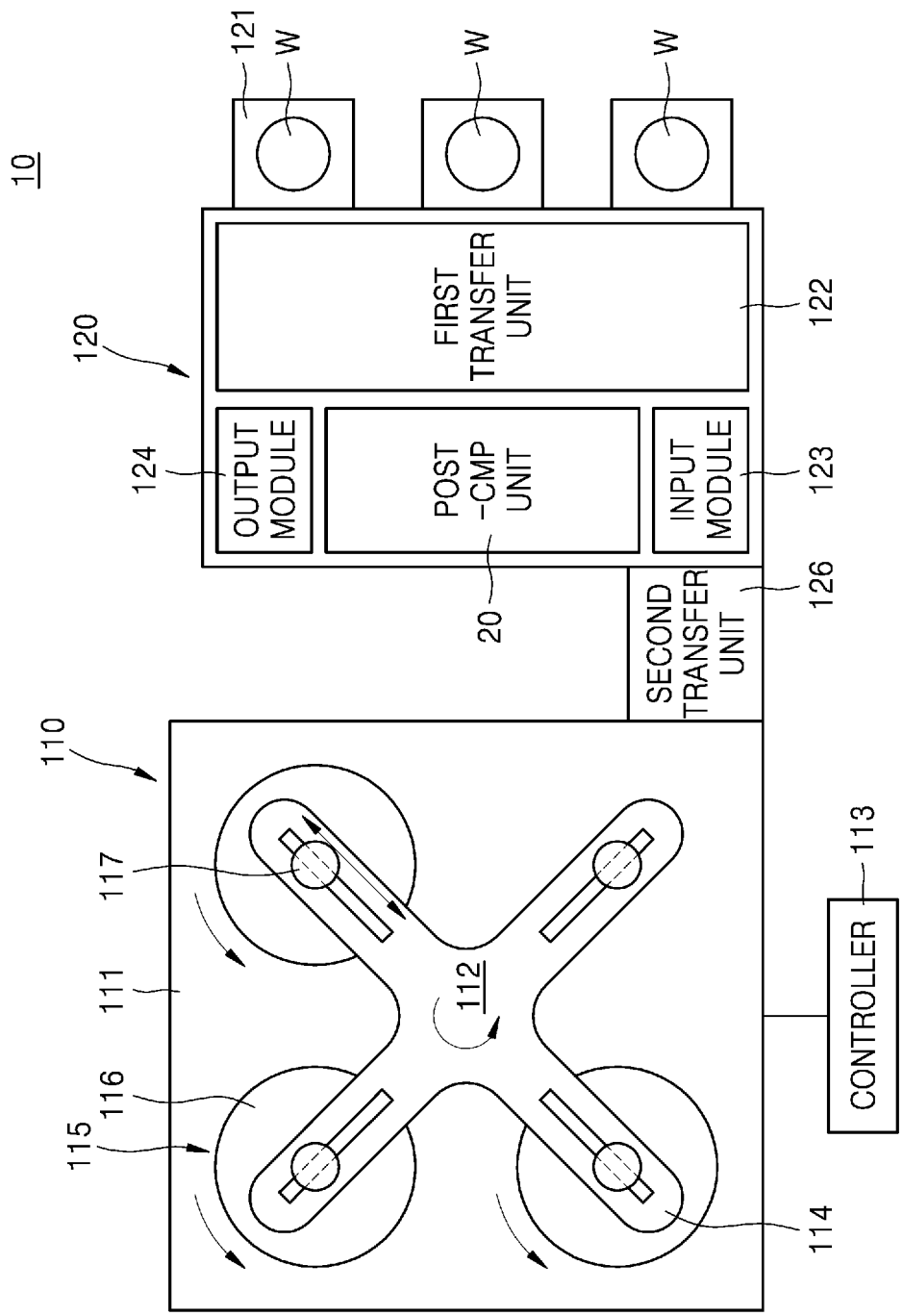
FIG. 1 is a top view of a wafer processing system that includes wafer cleaning equipment, according to embodiments.

Hereinafter, embodiments are described in detail with reference to the accompanying drawings. In the drawings, the same reference numbers may refer to the same components.

FIG. 1 is a top view of a wafer processing system 10 that includes wafer cleaning equipment, according to embodiments.

Referring to FIG. 1, in an embodiment, the wafer processing system 10 includes chemical mechanical planarization (CMP) equipment 110 and a factory interface 120. The CMP equipment 110 includes an enclosure 111, a carousel 112, a controller 113, and at least one CMP station 115. The enclosure 111 is a space environmentally controlled to perform CMP. The carousel 112 and the CMP station 115 are disposed in the enclosure 111. For example, the carousel 112 is arranged at the center of the enclosure 111. The carousel 112 includes a plurality of supports 114 that each support a polishing head 117. A wafer W subject to CMP is loaded onto the polishing head 117. The carousel 112 rotates the supports 114 such that the polishing head 117 is repositioned above the CMP station 115. The polishing head 117 loaded with the wafer W repositioned above a polishing pad 116. The controller 113 facilitates control and integration of the CMP equipment 110 and the factory interface 120 that are included in the wafer processing system 10. For example, the controller 113 can be combined with various components of the wafer processing system 10 to facilitate planarization, cleaning, and transfer processes. The CMP station 115 planarizes the wafer W loaded onto the polishing head 117. Although FIG. 1 shows three CMP stations 115 and four supports 114, embodiments are not necessarily limited thereto.

The factory interface 120 includes a wafer cassette 121, a first transfer unit 122, a second transfer unit 126, an input module 123, a post-CMP unit 20, and an output module 124. The wafer W can be stored in the wafer cassette 121 before or after CMP. Before CMP, the first transfer unit 122 moves the wafer W from the wafer cassette 121 to the input module 123. After CMP, the first transfer unit 122 moves the wafer W from the input module 123 to the post-CMP unit 20. The first transfer unit 122 moves the wafer W within the post-CMP unit 20 and moves the wafer W from the post-CMP unit 20 to the output module 124. The first transfer unit 122 moves the wafer W that has undergone post-CMP processing from the output module 124 to the wafer cassette 121.

The input module 123 stores the wafer W before being fed to the CMP equipment 110. The input module 123 stores the wafer W before the wafer W is fed to the post-CMP unit 20 after the wafer W has been received from the CMP equipment 110. The second transfer unit 126 moves the wafer W between the input module 123 and the CMP equipment 110. Although FIG. 1 shows that the second transfer unit 126 is outside the CMP equipment 110, embodiments are not necessarily limited thereto. In an embodiment, part of the second transfer unit 126 is arranged in the enclosure 111 of the CMP equipment 110. The post-CMP unit 20 removes residue or particles that remain in the wafer W after CMP. The post-CMP unit 20 is described in detail below. The output module 124 stores the wafer W that has undergone post-CMP processing.

The operation of the wafer processing system 10 is described below. The wafer W is transferred from one of wafer cassettes 121 to the input module 123 by the first transfer unit 122. The second transfer unit 126 loads the wafer W from the input module 123 onto the polishing head 117 of the CMP equipment 110. The wafer W is horizontally oriented on the polishing head 117. The polishing head 117 moves the wafer W above the polishing pad 116 of the CMP station 115, where the wafer W is polished. After the wafer W is polished, the wafer W is transferred to the input module 123 by the second transfer unit 126. The first transfer unit 122 retrieves and transfer the polished wafer W to the post-CMP unit 20. While being cleaned, the wafer W is vertically oriented in each piece of cleaning equipment of the post-CMP unit 20. The post-CMP processed wafer W is transferred to the output module 124. The first transfer unit 122 horizontally orients and transfers the post-CMP processed wafer W from the output module 124 to the wafer cassette 121.

Figure 2:
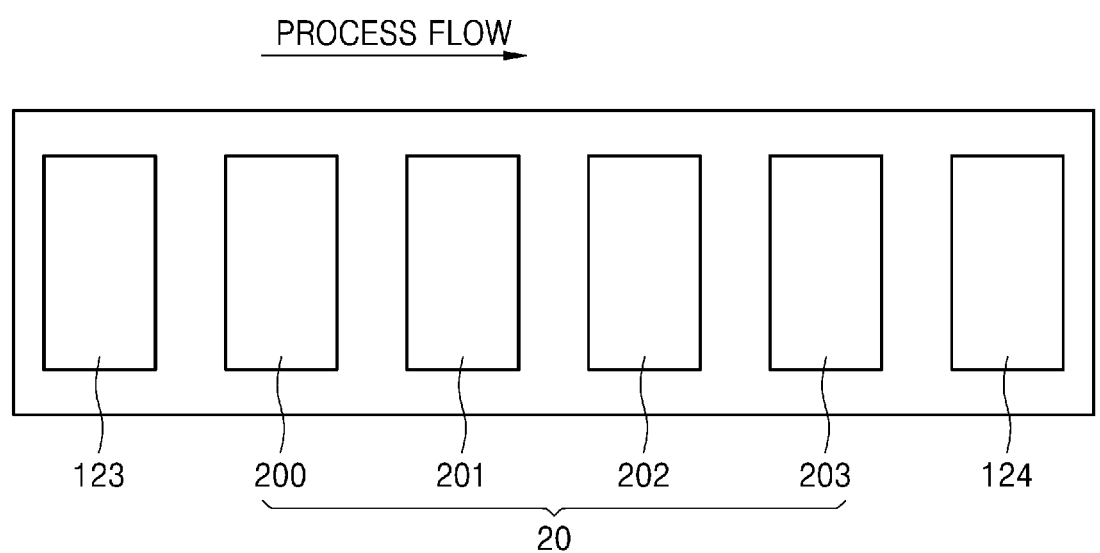
FIG. 2 is a schematic diagram of a post-chemical mechanical planarization (CMP) unit, according to embodiments.

FIG. 2 is a schematic diagram of a post-CMP unit, according to embodiments.

Referring to FIG. 2, in an embodiment, the post-CMP unit 20 includes wafer cleaning equipment 200, first brush equipment 201, second brush equipment 202, and wafer drying equipment 203. The wafer cleaning equipment 200 chemically and mechanically removes residue or particles that remain on a polished wafer after CMP. A wafer stored in the input module 123 is moved sequentially through the wafer cleaning equipment 200, the first brush equipment 201, the second brush equipment 202, and the wafer drying equipment 203 to the output module 124. Each of the wafer cleaning equipment 200, the first brush equipment 201, the second brush equipment 202, and the wafer drying equipment 203 processes a wafer while the polished surface of the wafer is vertically oriented. Although FIG. 2 shows that the post-CMP unit 20 includes three additional pieces of post-processing equipment besides the wafer cleaning equipment 200, embodiments are not necessarily limited thereto.

Figure 3A:
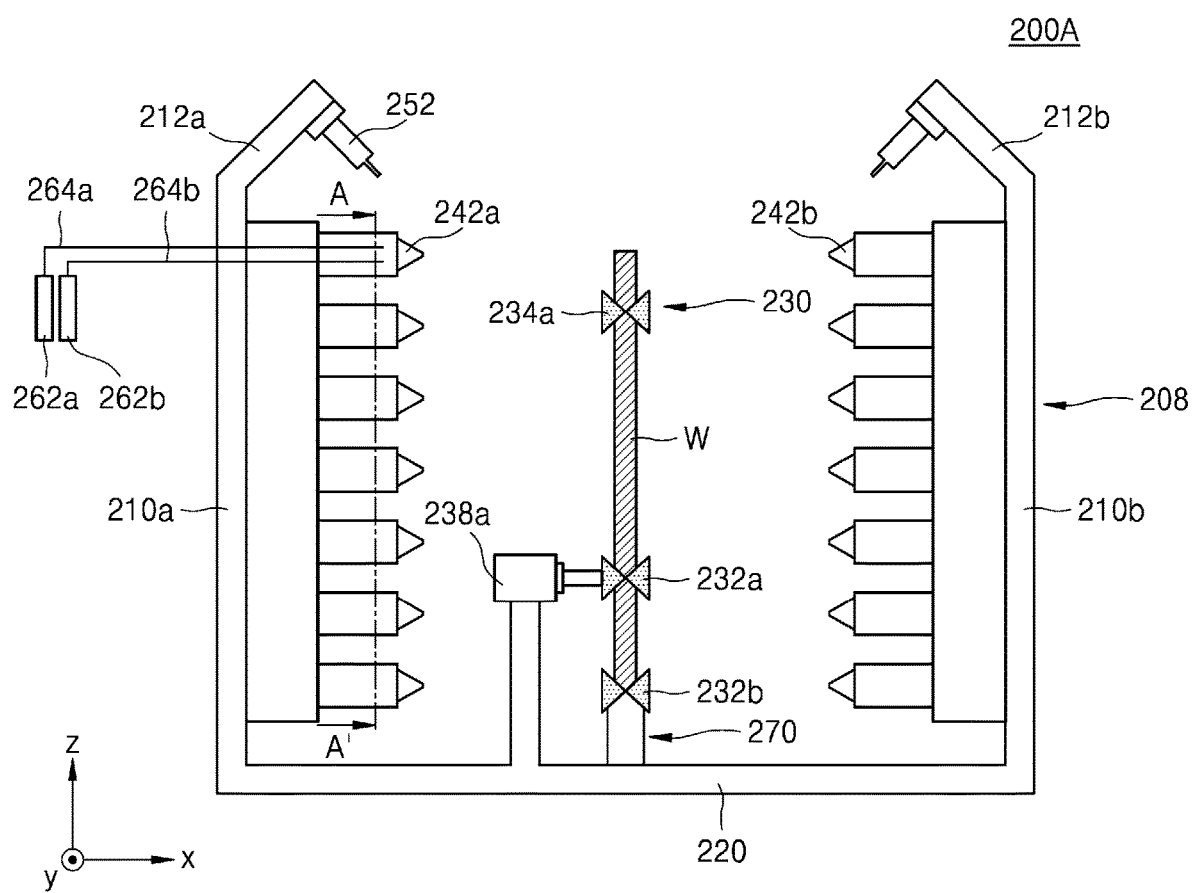
FIG. 3A is a cross-sectional view of wafer cleaning equipment according to embodiments.
Figure 3B:
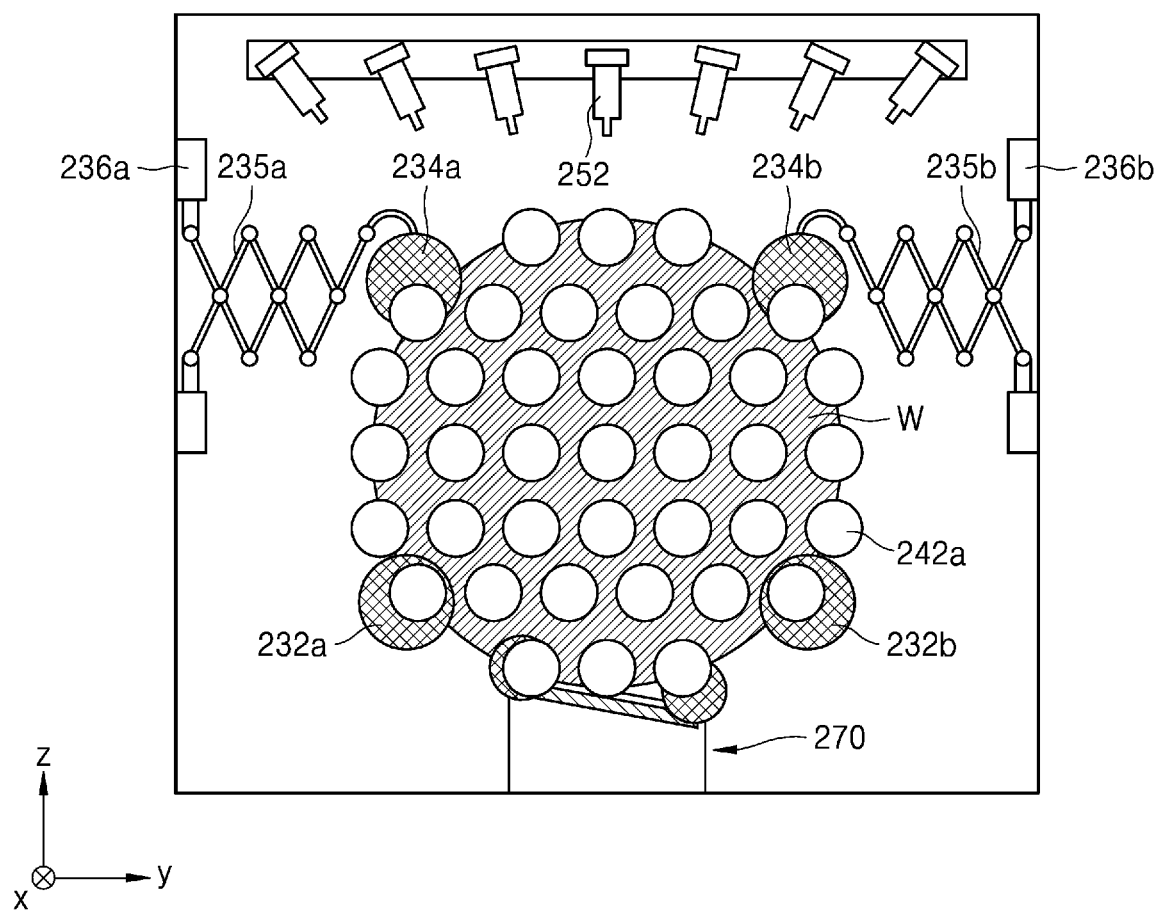
FIG. 3B is a cross-sectional view of the wafer cleaning equipment, taken along line A-A' in FIG. 3A.
Figure 4:
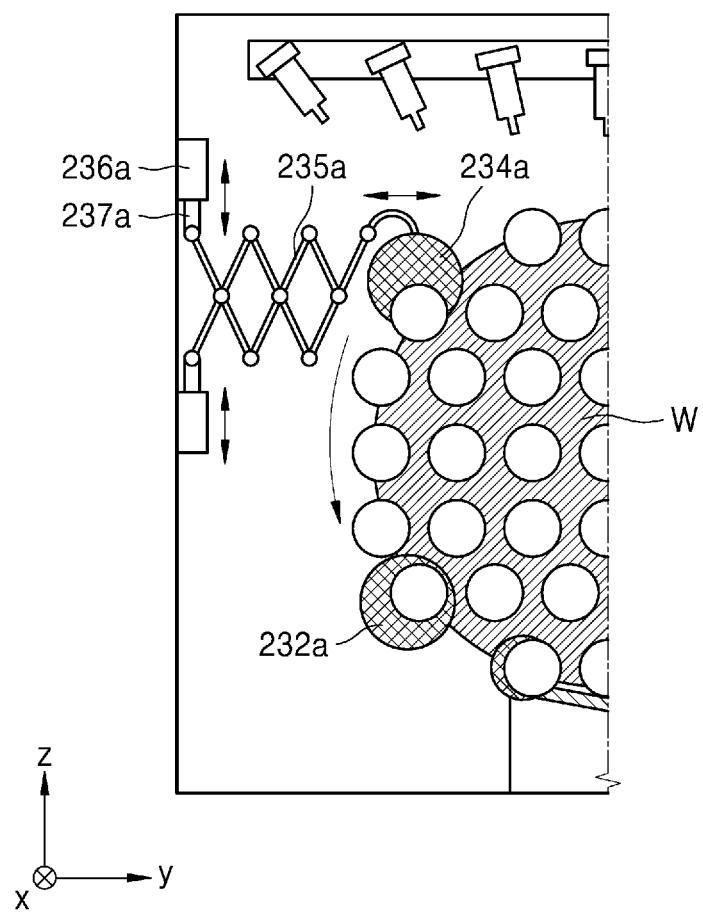
FIG. 4 is a cross-sectional view of a support structure in FIG. 3A.

FIG. 3A is a cross-sectional view of a wafer cleaning equipment 200A according to embodiments. FIG. 3B is a cross-sectional view of the wafer cleaning equipment 200A, taken along line A-A' in FIG. 3A. FIG. 4 is a cross-sectional view of a support structure 230 in FIG. 3A.

Referring to FIG. 3A, in an embodiment, a vessel 208 includes a first inner wall 210a, a second inner wall 210b, a bottom 220, a plurality of first nozzles 242a, a plurality of second nozzles 242b, the support structure 230, and a megasonic cleaner 270.

According to an embodiment, the vessel 208 provides an inner space for cleaning the wafer W. The wafer cleaning equipment 200A includes a cover that can be opened or closed such that the wafer W can be placed into or removed from the wafer cleaning equipment 200A, but embodiments are not necessarily limited thereto. The second inner wall 210b faces the first inner wall 210a. For example, the first inner wall 210a faces the second inner wall 210b in an X-axis direction. The first inner wall 210a and the second inner wall 210b are parallel with a virtual plane that is parallel with a Y-axis direction and a Z-axis direction. The bottom 220 of the vessel 208 is connected to the first inner wall 210a and the second inner wall 210b. For example, the bottom 220 of the vessel 208 includes a rectangular plate parallel with a virtual plane that is parallel with the X-axis direction and the Y-axis direction. However, the shape of the bottom 220 of the vessel 208 is not necessarily limited to a rectangular plate.

Referring to FIGS. 3A and 3B, in an embodiment, the first nozzles 242a are disposed on the first inner wall 210a. The first nozzles 242a are arranged in a circular pattern on the first inner wall 210a to uniformly spray fluid to the entire wafer W, but embodiments are not necessarily limited thereto. The first nozzles 242a are aimed at the main surface of the wafer W. The second nozzles 242b are disposed on the second inner wall 210b. The second nozzles 242b are arranged in a circular pattern on the second inner wall 210b to uniformly spray fluid to the entire wafer W, but embodiments are not necessarily limited thereto. The second nozzles 242b are aimed at the bottom surface of the wafer W.

The first nozzles 242a and the second nozzles 242b are symmetrically arranged with respect to the wafer W. Accordingly, the wafer W is prevented from being damaged by a biased pressure that results from fluid applied to either the main surface or the bottom surface of the wafer W.

According to an embodiment, each of the first nozzles 242a is connected to a first fluid supplier 262a and a second fluid supplier 262b. Each of the first nozzles 242a is connected to the first fluid supplier 262a and the second fluid supplier 262b respectively through a first fluid supply line 264a and a second fluid supply line 264b. Only first fluid flows through the first fluid supply line 264a, and second fluid flows through the second fluid supply line 264b. The first fluid includes a gas, such as $N_2$, and the second fluid includes distilled water, but embodiments are not necessarily limited thereto. The first fluid and the second fluid move respectively from the first fluid supplier 262a and the second fluid supplier 262b respectively through the first fluid supply line 264a and the second fluid supply line 264b to each of the first nozzles 242a and are mixed with each other before being sprayed onto the wafer W through the first nozzles 242a. Although FIG. 3A shows that the first fluid supply line 264a, the second fluid supply line 264b, the first fluid supplier 262a, and the second fluid supplier 262b are connected to each of the first nozzles 242a, embodiments are not necessarily limited thereto. In an embodiment, first and second fluid supply lines and first and second fluid suppliers are connected to each of the second nozzles 242b.

Referring to FIGS. 3A and 3B, in an embodiment, the vessel 208 includes the first inner wall 210a and the second inner wall 210b opposite the first inner wall 210a. The first inner wall 210a and the second inner wall 210b are respectively connected to a first sloping inner wall 212a and a second sloping inner wall 212b. The first sloping inner wall 212a is inclined at an angle from about 0□ to about 60□ in the positive-axis direction with respect to a plane defined by the Y-axis and the Z-axis. The second sloping inner wall 212b is inclined at an angle from about 0□ to about 60□ in the negative X-axis direction with respect to a plane formed by the Y-axis and the Z-axis. A plurality of rinse nozzles 252 are disposed on the first and second sloping inner walls 212a and 212b. The rinse nozzles 252 are aimed at the wafer W at different angles with respect to a plane defined by the Z-axis and the X-axis.

Referring to FIGS. 3A and 4, in an embodiment, the wafer W is vertically oriented between the first nozzles 242a and the second nozzles 242b. For example, the wafer W includes a main surface and a bottom surface opposite the main surface. The main surface of the wafer W has undergone CMP. The support structure 230 that supports the wafer W is disposed between the first nozzles 242a and the second nozzles 242b. The wafer W is loaded onto the support structure 230 such that the main surface of the wafer W faces one of the first inner wall 210a or the second inner wall 210b. The support structure 230 includes a first lower support 232a, a second lower support 232b, a first upper support 234a, and a second upper support 234b. The first lower support 232a and the second lower support 232b are coupled to a lower portion of the wafer W to support the wafer W. The first lower support 232a and the second lower support 232b are connected to a motor 238a. The first lower support 232a and the second lower support 232b each have a cylindrical shape and receive the torque of the motor 238a and integrally rotate with the wafer W.

Referring to FIG. 4, in an embodiment, the first upper support 234a is coupled to an upper portion of the wafer W. The first upper support 234a has a cylindrical shape and integrally rotates with the rotating wafer W. The first upper support 234a is connected to a first support arm 235a. The first support arm 235a includes rods that intersect with each other at a fixing pin, thereby enabling the first upper support 234a to horizontally move. The first support arm 235a is connected to a first cylinder 237a that is vertically movable such that the first upper support 234a can vertically move. The first cylinder 237a is coupled to a support pillar 236a on the first inner wall 210a. Accordingly, the first upper support 234a can vertically and horizontally move along with the rotational motion of the wafer W during cleaning. Due to the vertical and horizontal movements of the first upper support 234a, stress that may be applied to the wafer W during cleaning is decreased, thereby preventing the wafer W from breaking. Although FIG. 4 only shows the first upper support 234a, the descriptions above are not limited to the first upper support 234a also apply to the second upper support 234b, a second support arm 235b, and a second support pillar 236b.

Referring to FIGS. 3A and 3B, in an embodiment, the megasonic cleaner 270 is disposed between the bottom 220 of the vessel 208 and the wafer W supported by the support structure 230. For example, the megasonic cleaner 270 may be disposed on the bottom 220 of the vessel 208 or separated from the bottom 220 of the vessel 208, but is not necessarily limited to those arrangements. The megasonic cleaner 270 is described in detail with reference to FIG. 5D below.

FIGS. 5A to 5G illustrate stages of an operating process of the wafer cleaning equipment 200A, according to embodiments.

Figure 5A:
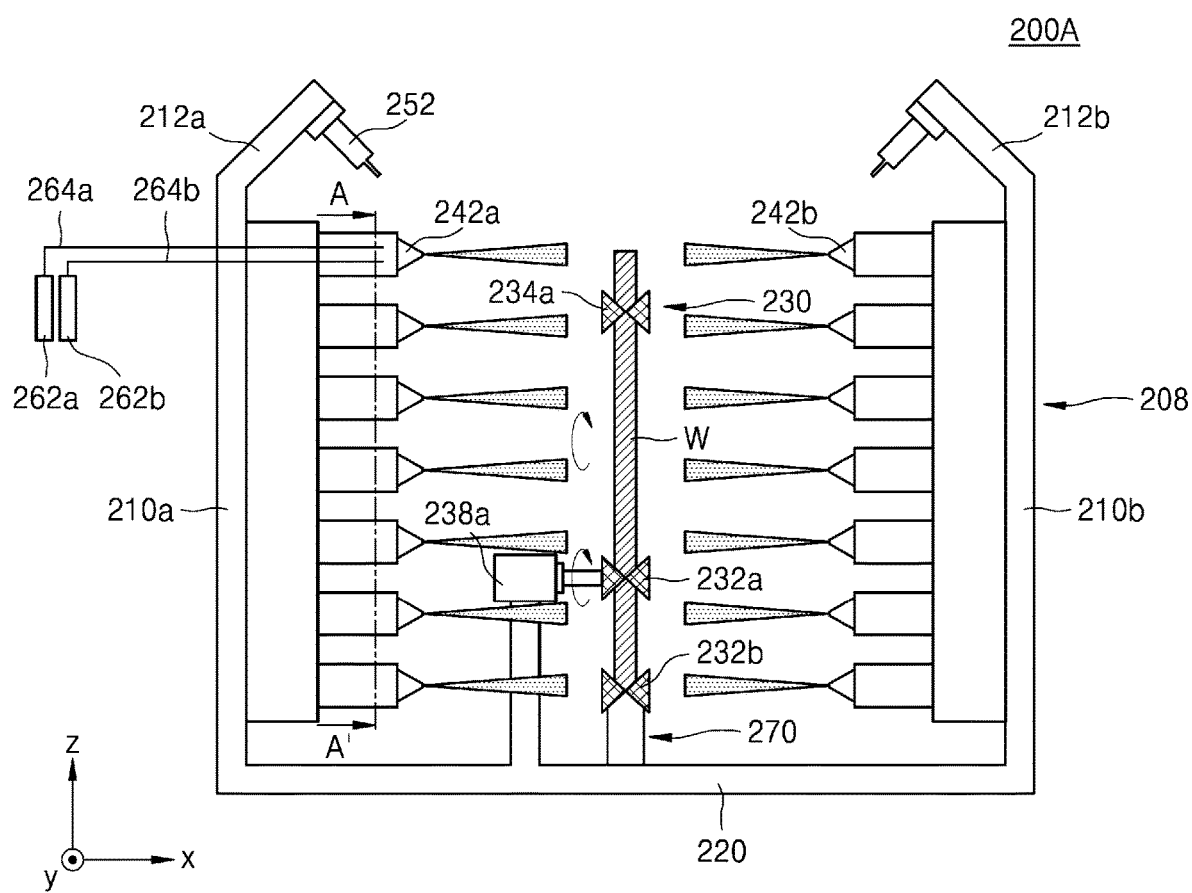
FIGS. 5A to 5G illustrate stages of an operating process of wafer cleaning equipment, according to embodiments.
Figure 5B:
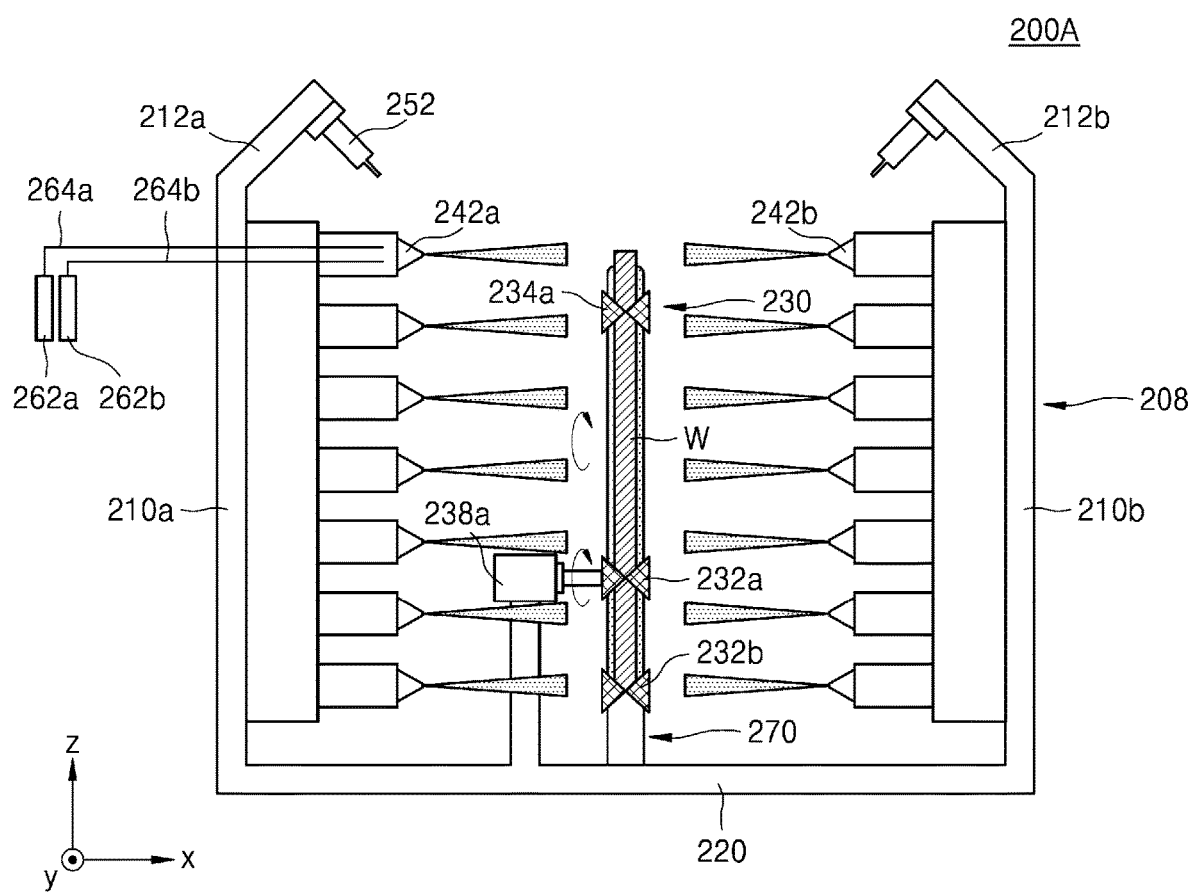
Figure 5C:
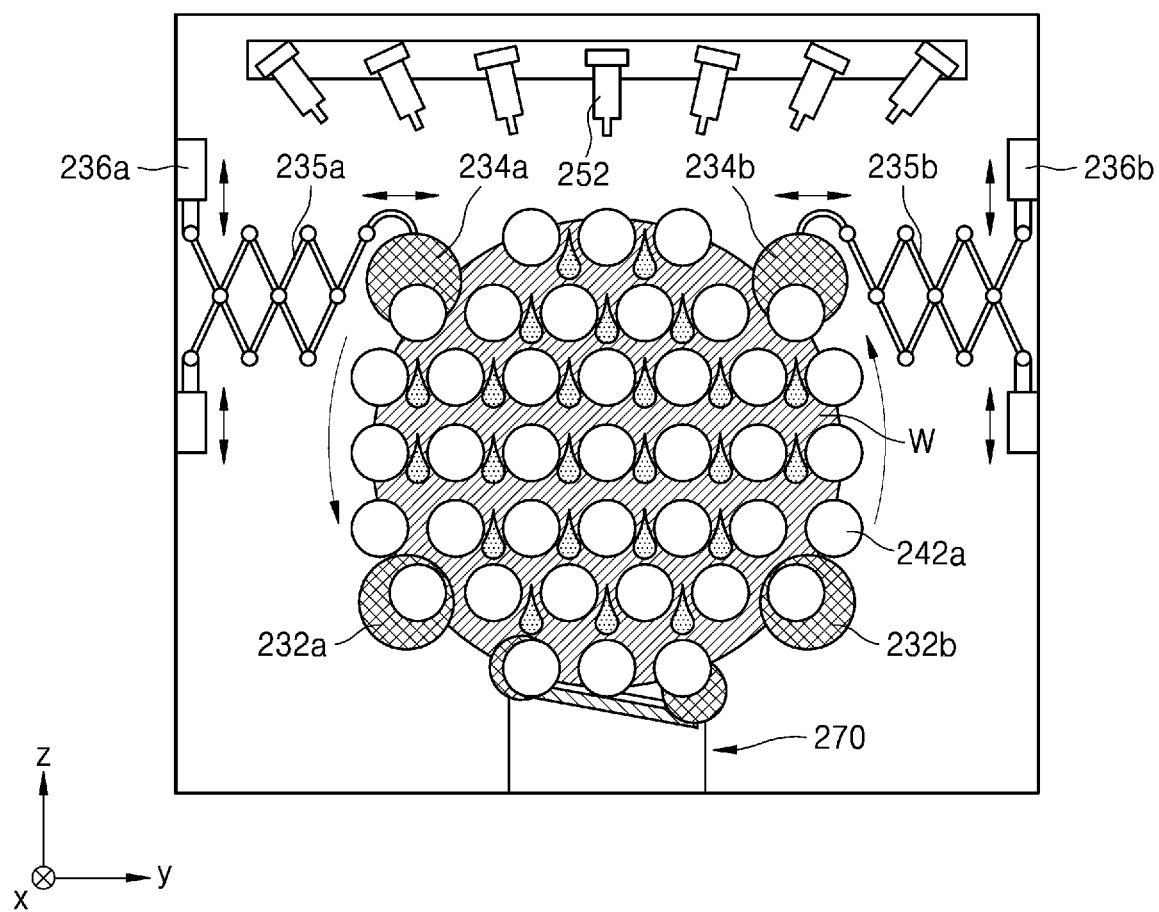

Referring to FIGS. 5A and 5B, in an embodiment, the support structure 230 includes the first lower support 232a, the second lower support 232b, the first upper support 234a, and the second upper support 234b. The first lower support 232a and the second lower support 232b are coupled to a lower portion of the wafer W to support the wafer W. The first lower support 232a and the second lower support 232b are connected to the motor 238a. The first lower support 232a and the second lower support 232b each have a cylindrical shape and receive the torque of the motor 238a and thus integrally rotate with the wafer W. Referring to FIG. 5C, in an embodiment, the wafer W rotates counter-clockwise. While the wafer W is rotating, fluid is sprayed from the first nozzles 242a and the second nozzles 242b. The first nozzles 242a spray fluid to the main surface of the wafer W, and the second nozzles 242b spray fluid to the bottom surface of the wafer W. The fluid sprayed from the first and second nozzles 242a and 242b chemically separates residue or particles that adhere to a surface of the wafer W from the wafer W. The fluid sprayed from the first and second nozzles 242a and 242b flows down the surfaces of the wafer W.

Referring to FIG. 5C, in an embodiment, the first upper support 234a and the second upper support 234b are coupled to the upper portion of the wafer W. The first upper support 234a and the second upper support 234b each have a cylindrical shape and integrally rotate with the rotating wafer W. The first upper support 234a is connected to the first support arm 235a, and the second upper support 234b is connected to the second support arm 235b. The first upper support 234a and the second upper support 234b can move vertically and horizontally. Due to the vertical and horizontal movements of the first and second upper supports 234a and 234b, stress that may be applied to the wafer W during cleaning is decreased, thereby preventing the wafer W from breaking. The first upper support 234a and the second upper support 234b can support the wafer W such that the wafer W does not separate from the support structure 230 while the wafer W is integrally rotating with the first lower support 232a and the second lower support 232b.

Figure 5D:
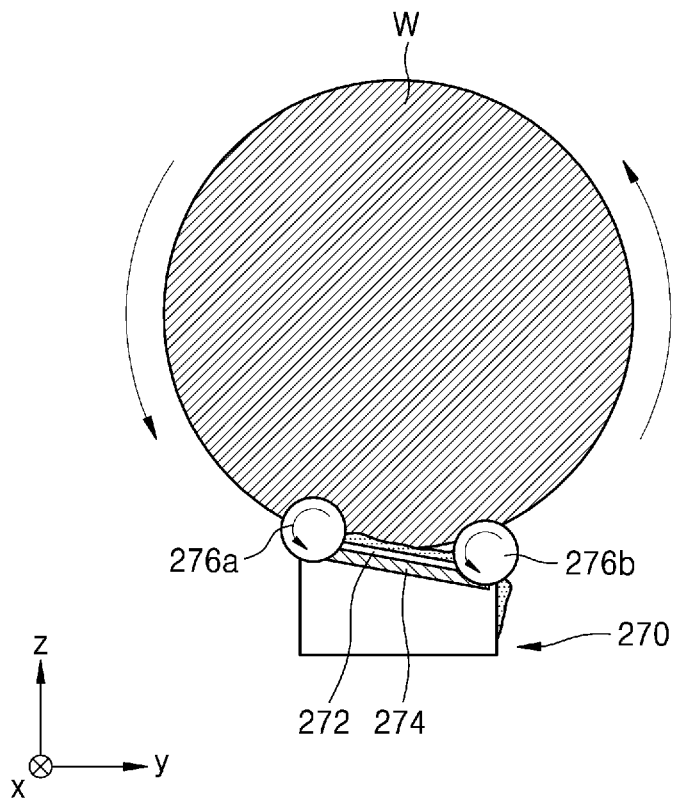
Figure 5E:
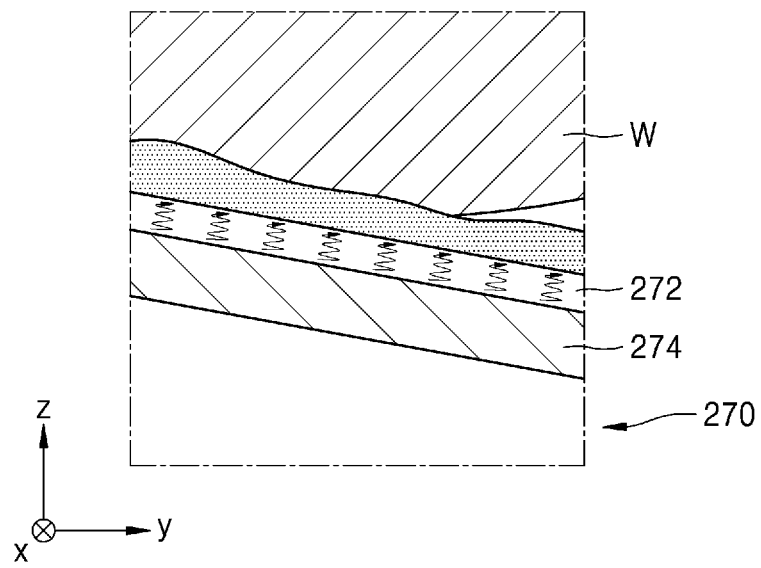

Referring to FIGS. 5C to 5E, in an embodiment, the fluid sprayed from the first and second nozzles 242a and 242b flows down the surfaces of the wafer W. The megasonic cleaner 270 is disposed between the bottom 220 of the vessel 208 and the wafer W supported by the support structure 230. For example, the megasonic cleaner 270 is disposed on the bottom 220 of the vessel 208 or is separated from the bottom 220 of the vessel 208. The megasonic cleaner 270 includes a rack 272, at least one vibrator 274 located below the rack 272, a first megasonic support 276a, and a second megasonic support 276b. The first megasonic support 276a and the second megasonic support 276b are coupled to a lower portion of the wafer W and support the wafer W. The first megasonic support 276a and the second megasonic support 276b each have a cylindrical shape and integrally rotate with the rotating wafer W.

Referring to FIG. 5E, in an embodiment, the rack 272 is inclined at a predetermined angle with respect to a virtual plane that is parallel with the X-axis and the Y-axis. Fluid that has been sprayed from the first and second nozzles 242a and has flowed down the surfaces of the wafer W flows down the rack 272. The vibrator 274 below the rack 272 transmits energy to the fluid as waves. In an embodiment, the vibrator 274 is a piezoelectric transducer. A piezoelectric transducer converts input pressure into electrical energy by using a piezoelectric effect, converts the electrical energy into acoustic energy, and outputs the acoustic energy. For example, the vibrator 274 generates an acoustic field having a frequency of several hundreds of kHz. When the pressure power of the vibrator 274 is increased, cleaning efficiency increases. However, a shock wave caused by a cavity may become too large so that a pattern formed on the wafer W collapses or membranes are damaged. Accordingly, the pressure power of the vibrator 274 is controlled within a range that does not cause damage to the wafer W. As the vibrator 274 forms an acoustic field in fluid, the pressure of the fluid repeatedly decreases and increases at different points of the fluid over time. Accordingly, the fluid repeatedly contracts and expands, and when the fluid has a negative pressure below the vapor pressure, a cavity may form. When the pressure of the fluid is greater than a certain level, such as the surface tension of the fluid, the cavity may explode and produce a large shock wave. A fluid that is repeatedly contracted and expanded by the vibrator 274 can remove substances, such as slurry, that have adhered to the wafer W. The megasonic cleaner 270 cleans the wafer W by transmitting energy as waves to the fluid, which flows down the wafer W after being sprayed onto the wafer W, without the fluid being supplied through a separate fluid supply line.

Figure 5F:
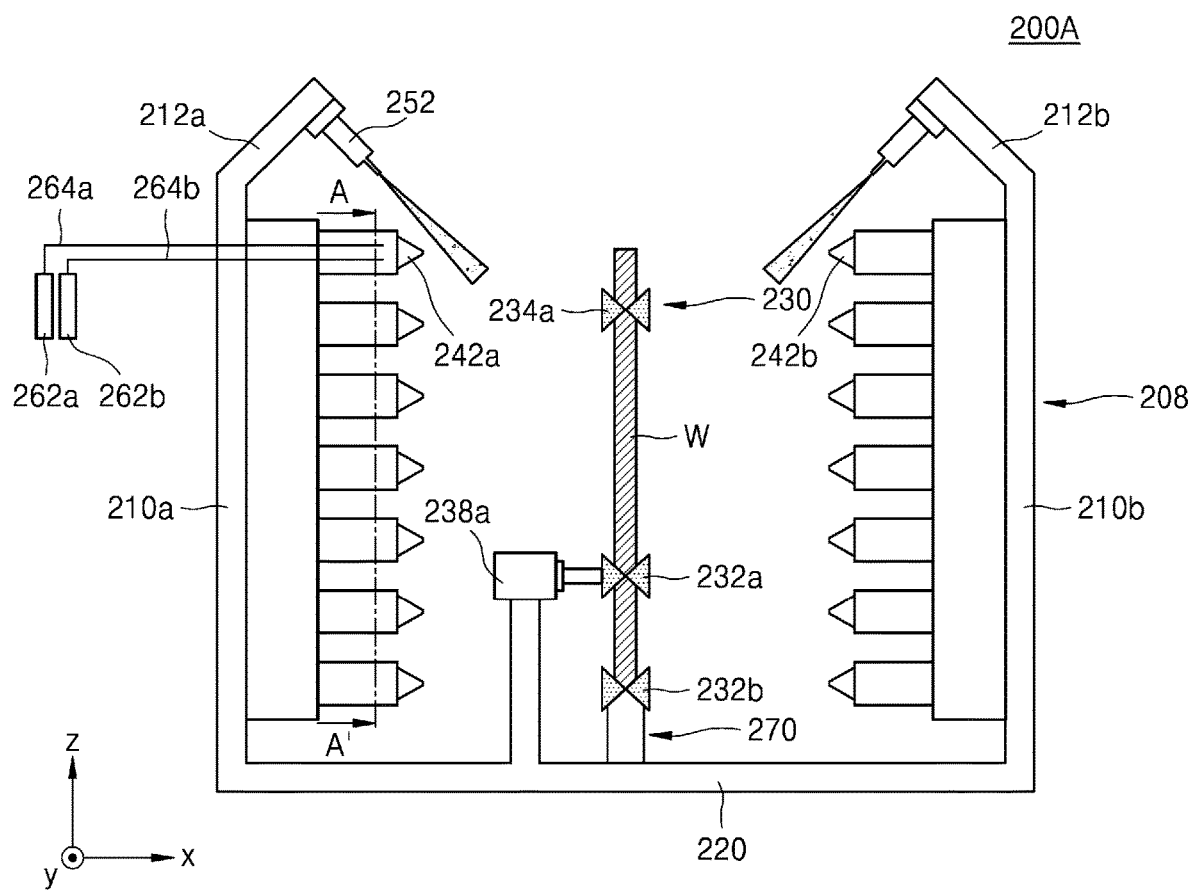
Figure 5G:
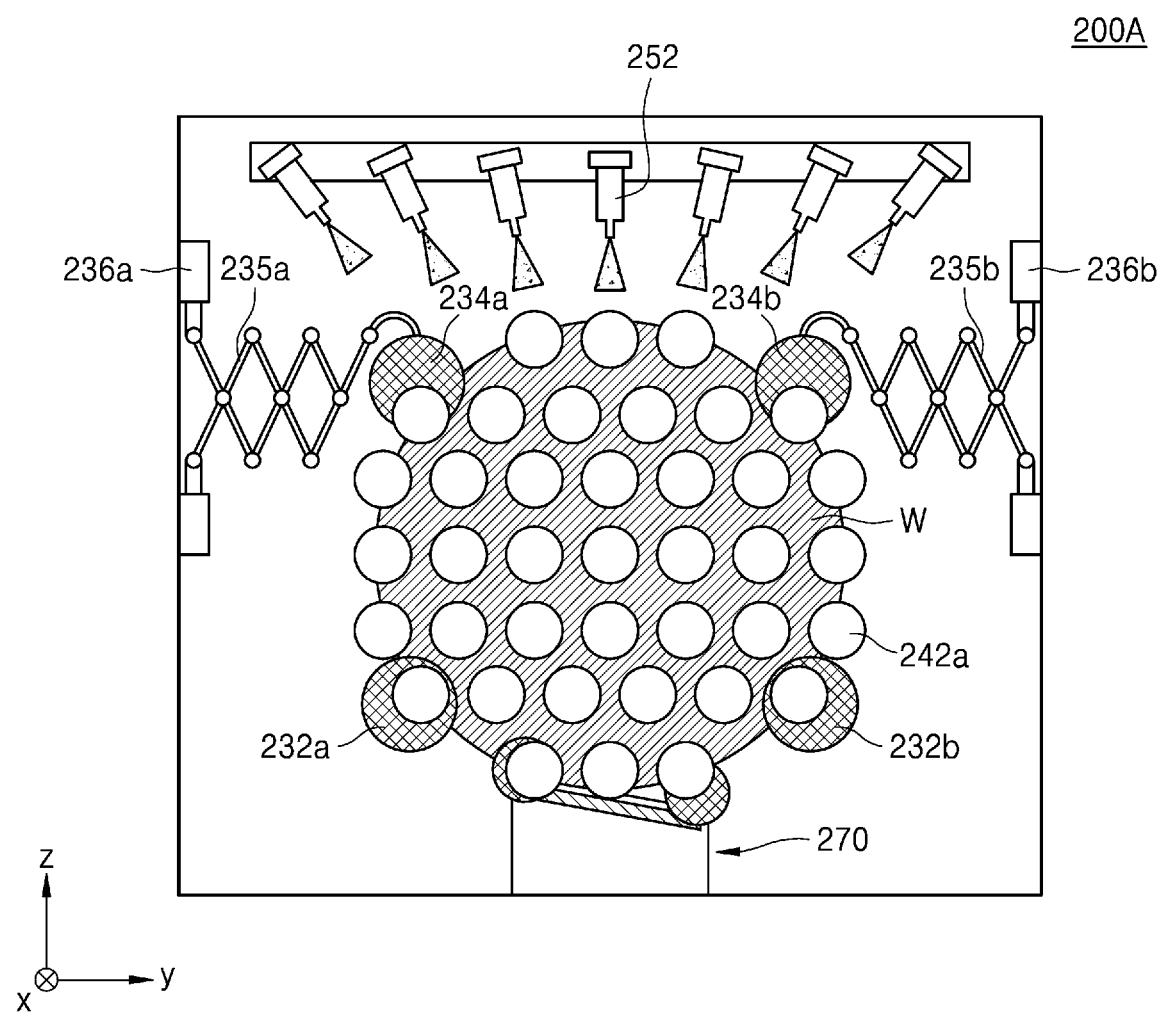

Referring to FIGS. 5F and 5G, in an embodiment, when a cleaning process that uses the first nozzles 242a, the second nozzles 242b, and the megasonic cleaner 270 is completed, a cleaning process that uses the rinse nozzles 252 is performed. In the cleaning process that uses the rinse nozzles 252, the wafer W is cleaned by deionized water. The rinse nozzles 252 are aimed at the wafer W and have different angles with respect to a plane formed by the Z-axis and the X-axis.

Figure 6A:
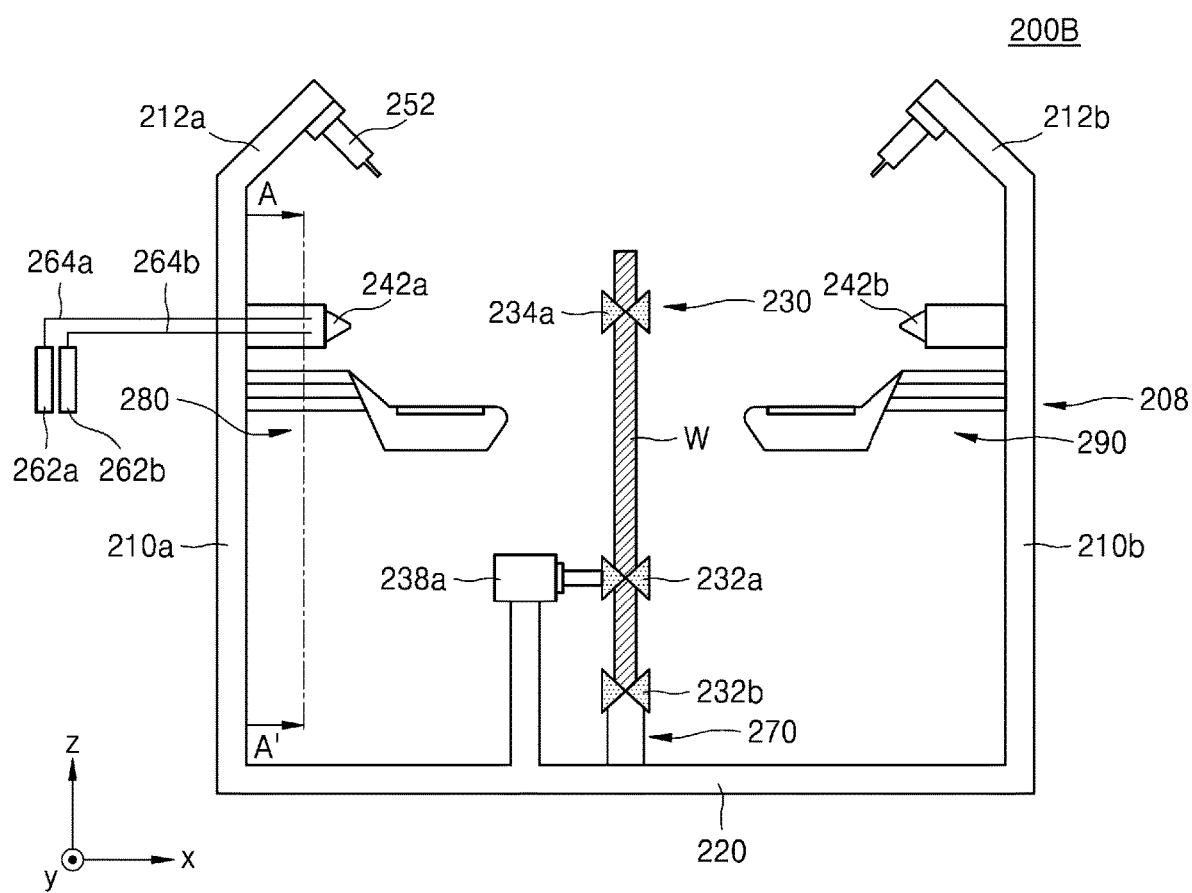
FIG. 6A is a cross-sectional view of wafer cleaning equipment according to embodiments.
Figure 6B:
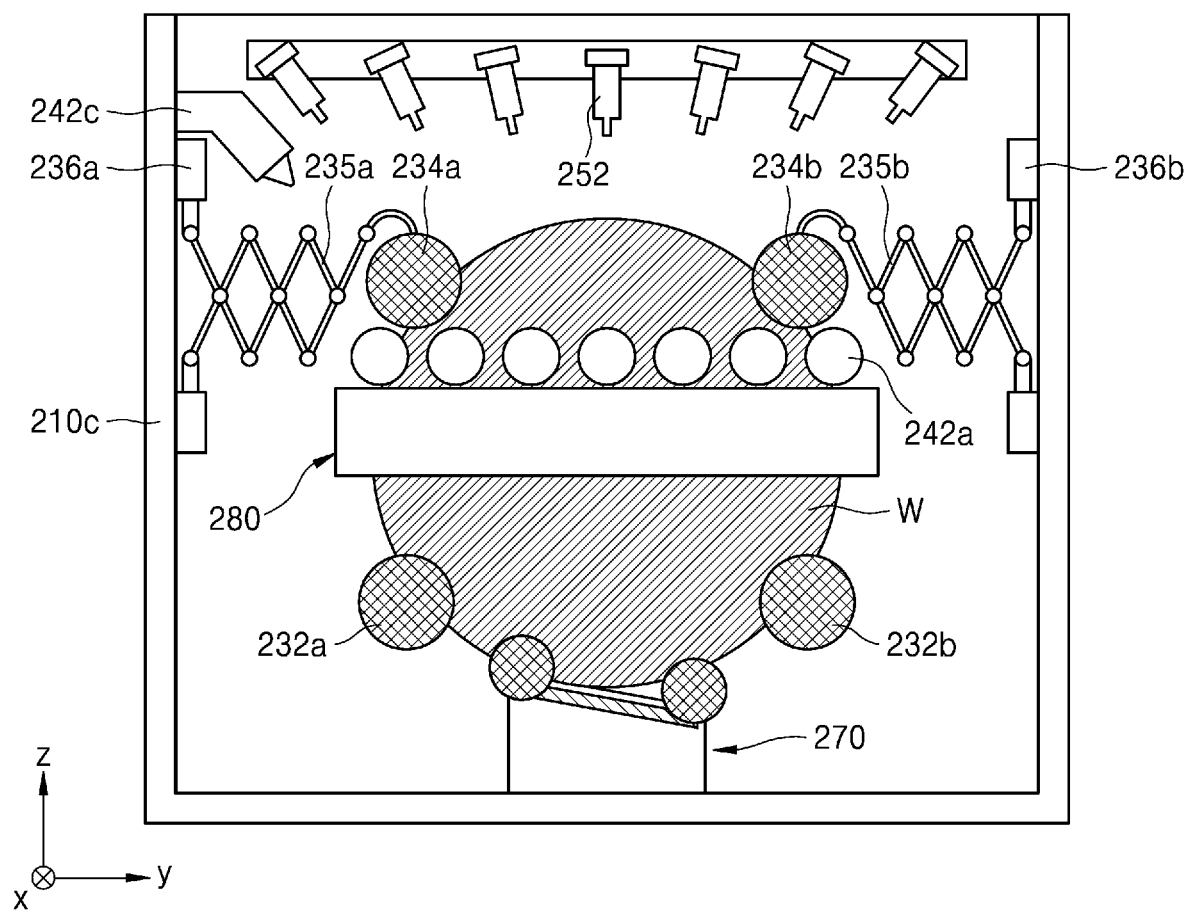
FIG. 6B is a cross-sectional view of wafer cleaning equipment, taken along line A-A' in FIG. 6A.
Figure 7:
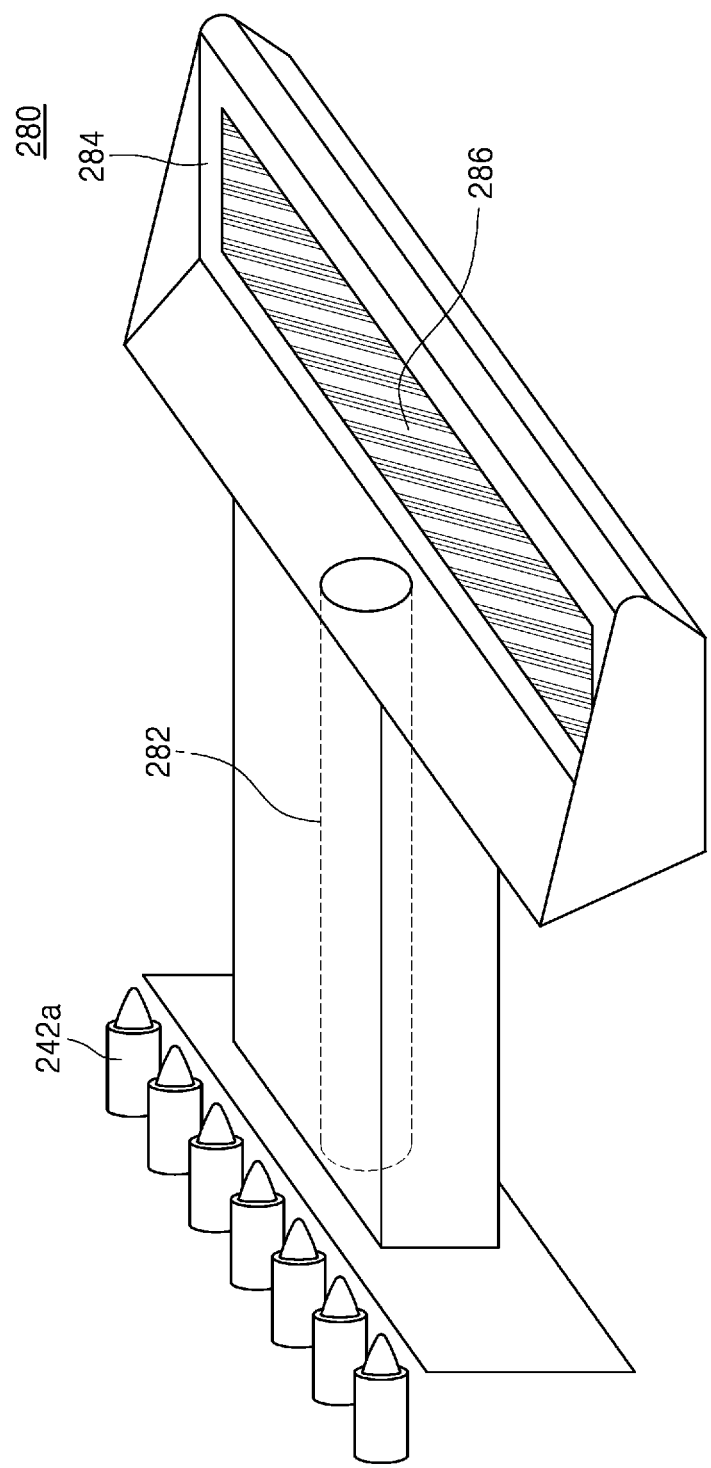
FIG. 7 is a cross-sectional view of a first megasonic cleaner in FIG. 6A.

FIG. 6A is a cross-sectional view of wafer cleaning equipment 200B according to embodiments. FIG. 6B is a cross-sectional view of the wafer cleaning equipment 200B, taken along line A-A' in FIG. 6A. FIG. 7 is a cross-sectional view of a first megasonic cleaner 280 in FIG. 6A.

Referring to FIGS. 6A and 6B, in an embodiment, the vessel 208 includes the first inner wall 210a, the second inner wall 210b, the bottom 220, a plurality of first nozzles 242a, a plurality of second nozzles 242b, the support structure 230, and the megasonic cleaner 270. The vessel 208 further includes a third inner wall 210c perpendicularly connected to the first and second inner walls 210a and 210b.

According to an embodiment, the vessel 208 provides an inner space for cleaning the wafer W. The wafer cleaning equipment 200B includes a cover that can be opened or closed such that the wafer W can be placed into or removed from the wafer cleaning equipment 200B, but embodiments are not necessarily limited thereto. The second inner wall 210b faces the first inner wall 210a. For example, the first inner wall 210a faces the second inner wall 210b in the X-axis direction. The first inner wall 210a and the second inner wall 210b are parallel with a virtual plane that is parallel with the Y-axis direction and the Z-axis direction. The bottom 220 of the vessel 208 is connected to the first inner wall 210a and the second inner wall 210b. For example, the bottom 220 of the vessel 208 includes a rectangular plate parallel with a virtual plane that is parallel with the X-axis direction and the Y-axis direction. However, the shape of the bottom 220 of the vessel 208 is not necessarily limited to a rectangular plate.

Referring to FIGS. 6A and 6B, in an embodiment, the first nozzles 242a are disposed on the first inner wall 210a. The first nozzles 242a are arranged in line on the first inner wall 210a, but embodiments are not necessarily limited thereto. The first nozzles 242a are aimed at the main surface of the wafer W. The second nozzles 242b are disposed on the second inner wall 210b. The second nozzles 242b are arranged in line on the second inner wall 210b, but embodiments are not necessarily limited thereto. The second nozzles 242b are aimed at the bottom surface of the wafer W. The first nozzles 242a and the second nozzles 242b are symmetrically disposed with respect to the wafer W. Accordingly, the wafer W is prevented from being damaged because of biased pressure due to fluid being applied to either the main surface or the bottom surface of the wafer W.

According to an embodiment, each of the first nozzles 242a is connected to the first fluid supplier 262a and the second fluid supplier 262b. Each of the first nozzles 242a is connected to the first fluid supplier 262a and the second fluid supplier 262b respectively through the first fluid supply line 264a and the second fluid supply line 264b. Although FIG. 6A shows that the first fluid supply line 264a, the second fluid supply line 264b, the first fluid supplier 262a, and the second fluid supplier 262b are connected to each of the first nozzles 242a, embodiments are not necessarily limited thereto. First and second fluid supply lines 264a and 264b and first and second fluid suppliers 262a and 262b are connected to each of the second nozzles 242b. The configurations and operations of the first fluid supplier 262a, the second fluid supplier 262b, the first fluid supply line 264a, and the second fluid supply line 264b of the wafer cleaning equipment 200B are the same as or similar to those of the wafer cleaning equipment 200A described above with reference to FIG. 3A.

Referring to FIGS. 6A and 6B, in an embodiment, the vessel 208 includes the first inner wall 210a and the second inner wall 210b opposite the first inner wall 210a. The first inner wall 210a and the second inner wall 210b are respectively connected to the first sloping inner wall 212a and the second sloping inner wall 212b. A plurality of rinse nozzles 252 are disposed on the first and second sloping inner walls 212a and 212b. The configurations of the first and second sloping inner walls 212a and 212b and the rinse nozzles 252 of the wafer cleaning equipment 200B are the same as or similar to those of the wafer cleaning equipment 200A described above with reference to FIGS. 3A and 3B.

Referring to FIG. 6A, in an embodiment, the wafer W is vertically oriented between the first nozzles 242a and the second nozzles 242b. The wafer W includes a main surface and a bottom surface opposite the main surface. The main surface of the wafer W has undergone CMP. The support structure 230 that supports the wafer W is disposed between the first nozzles 242a and the second nozzles 242b. The wafer W is loaded onto the support structure 230 such that the main surface of the wafer W faces one of the first inner wall 210a or the second inner wall 210b. The support structure 230 includes the first lower support 232a, the second lower support 232b, the first upper support 234a, and the second upper support 234b. The first lower support 232a and the second lower support 232b are coupled to a lower portion of the wafer W to support the wafer W. The first lower support 232a and the second lower support 232b are connected to the motor 238a. The first lower support 232a and the second lower support 232b each have a cylindrical shape and receive the torque of the motor 238a and thus integrally rotate with the wafer W.

Referring to FIGS. 6A, 6B, and 7, in an embodiment, the first megasonic cleaner 280 and a second megasonic cleaner 290 are respectively mounted on the first inner wall 210a and the second inner wall 210b. Each of the first megasonic cleaner 280 and the second megasonic cleaner 290 includes a pipe 282, a fluid receiving portion 284, and a vibrating pad 286. The pipe 282 supplies a cleaning solution to the fluid receiving portion 284. The fluid receiving portion 284 receives a cleaning solution discharged from the pipe 282. For example, the fluid receiving portion 284 includes a top surface parallel with the X-axis and the Y-axis, and the length of the top surface of the fluid receiving portion 284 is much greater than the height thereof. Not only the fluid discharged from the pipe 282, but also cleaning solutions that have been sprayed from the first nozzles 242a and the second nozzles 242b to the wafer W and spattered from the wafer W can be accommodated in the fluid receiving portion 284. The vibrating pad 286 is disposed on the bottom of the fluid receiving portion 284. The vibrating pad 286 transmits energy to a cleaning solution accommodated in the fluid receiving portion 284 as waves. The configuration and effect of the vibrating pad 286 are the same as or similar to those of the vibrator 274 described above with reference to FIG. 5E.

Referring to FIG. 6A, in an embodiment, the vessel 208 includes the first inner wall 210a, the second inner wall 210b, and the bottom 220. The second inner wall 210b faces the first inner wall 210a, and the bottom 220 is connected to the first and second inner walls 210a and 210b and is parallel with the X-axis and the Y-axis. Referring to FIG. 6B, the vessel 208 further includes the third inner wall 210c perpendicularly connected to the first and second inner walls 210a and 210b. A third nozzle 242c is disposed on the third inner wall 210c. The third nozzle 242c is aimed at a side surface of the wafer W. Fluid sprayed from the third nozzle 242c has identical or similar properties to fluid sprayed from the first and second nozzles 242a and 242b. The third nozzle 242c sprays fluid in a direction that does not disturb the rotation of the wafer W. If the wafer W rotates downwards and the third nozzle 242c sprays fluid to a side surface of the wafer W, which moves upwards, the rotation of the wafer W can be disturbed.

Referring to FIGS. 6A and 6B, in an embodiment, the wafer W is vertically oriented between the first nozzles 242a and the second nozzles 242b. The wafer W includes the main surface and the bottom surface opposite the main surface. The main surface of the wafer W has undergone CMP. The support structure 230 that supports the wafer W is disposed between the first nozzles 242a and the second nozzles 242b. The wafer W is loaded onto the support structure 230 such that the main surface of the wafer W faces one of the first inner wall 210a or the second inner wall 210b. The support structure 230 includes the first lower support 232a, the second lower support 232b, the first upper support 234a, and the second upper support 234b. The configurations and effects of the support structure 230, the first and second lower supports 232a and 232b, and the first and second upper supports 234a of the wafer cleaning equipment 200B are the same as or similar to those of the wafer cleaning equipment 200A described above with reference to FIGS. 3A and 3B.

Referring to FIGS. 6A and 6B, in an embodiment, the megasonic cleaner 270 is disposed between the bottom 220 of the vessel 208 and the wafer W. For example, the megasonic cleaner 270 may be disposed on the bottom 220 of the vessel 208 or separated from the bottom 220 of the vessel 208, but embodiments are not necessarily limited thereto. The configuration and effect of the megasonic cleaner 270 is the same as or similar to those of the megasonic cleaner 270 described above with reference to FIGS. 3A, 3B, and 5E.

FIGS. 8A to 8G illustrate stages of the operating process of the wafer cleaning equipment 200B, according to embodiments.

Figure 8A:
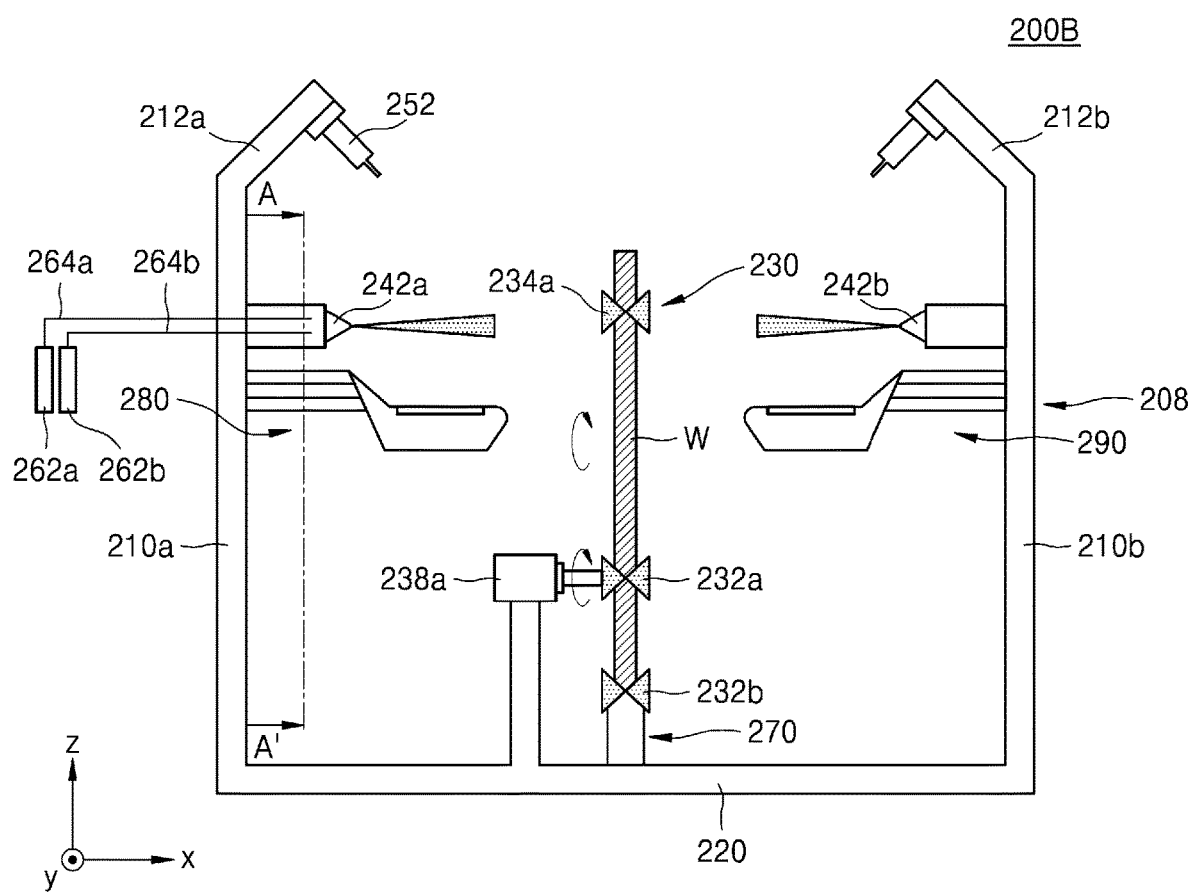
FIGS. 8A to 8G illustrate stages of an operating process of wafer cleaning equipment, according to embodiments.
Figure 8B:
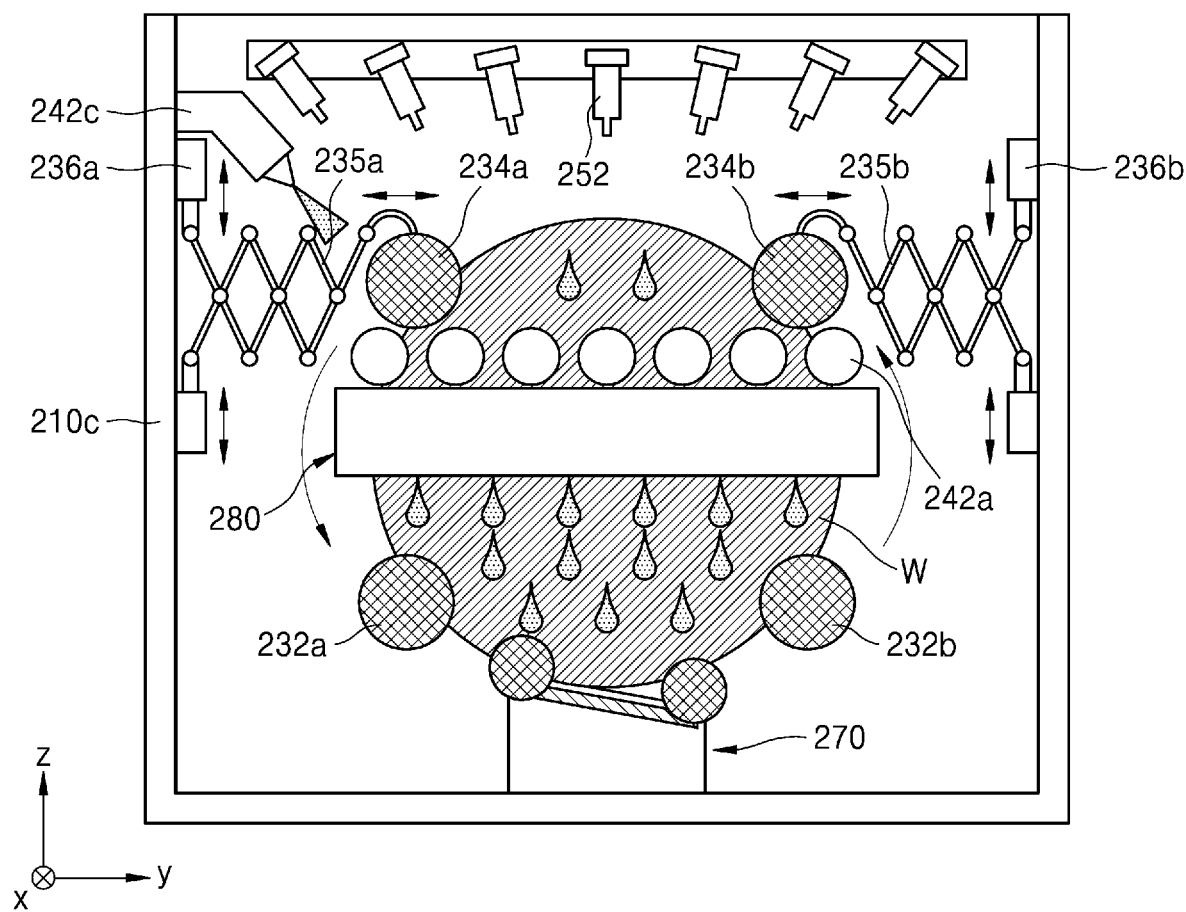

Referring to FIGS. 8A and 8B, in an embodiment, the support structure 230 includes the first lower support 232a, the second lower support 232b, the first upper support 234a, and the second upper support 234b. The first lower support 232a and the second lower support 232b are coupled to a lower portion of the wafer W to support the wafer W. The first lower support 232a and the second lower support 232b are connected to the motor 238a. The first lower support 232a and the second lower support 232b each have a cylindrical shape and receive the torque of the motor 238a and thus integrally rotate with the wafer W. Referring to FIG. 8B, in an embodiment, the wafer W rotates counter-clockwise. While the wafer W is rotating, fluid is sprayed from the first nozzles 242a and the second nozzles 242b. The first nozzles 242a spray fluid to the main surface of the wafer W, and the second nozzles 242b spray fluid to the bottom surface of the wafer W. The fluid sprayed from the first and second nozzles 242a and 242b chemically separates residue or particles that have adhered to a surface of the wafer W from the wafer W. The fluid sprayed from the first and second nozzles 242a and 242b flows down the surfaces of the wafer W.

Figure 8C:
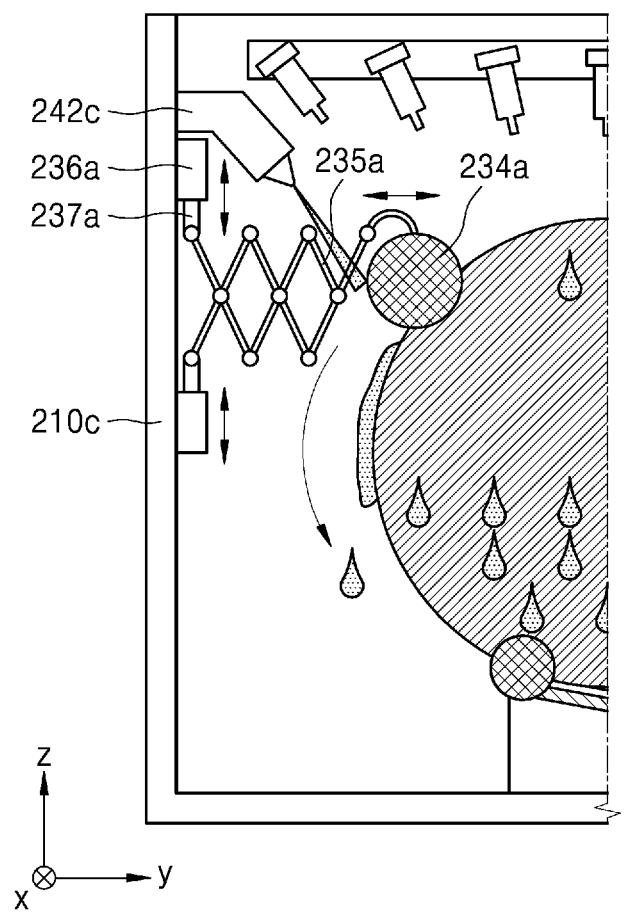

Referring to FIGS. 8B and 8C, in an embodiment, the first upper support 234a and the second upper support 234b are coupled to the upper portion of the wafer W. The first upper support 234a and the second upper support 234b each have a cylindrical shape and integrally rotate with the rotating wafer W. The first upper support 234a is connected to the first support arm 235a, and the second upper support 234b is connected to the second support arm 235b. The first upper support 234a and the second upper support 234b can move vertically and horizontally. Due to the vertical and horizontal movements of the first and second upper supports 234a and 234b, stress that may be applied to the wafer W during cleaning is decreased, thereby preventing the wafer W from breaking. The first upper support 234a and the second upper support 234b support the wafer W such that the wafer W does not separate from the support structure 230 while the wafer W is rotating integrally with the first lower support 232a and the second lower support 232b.

Figure 8D:
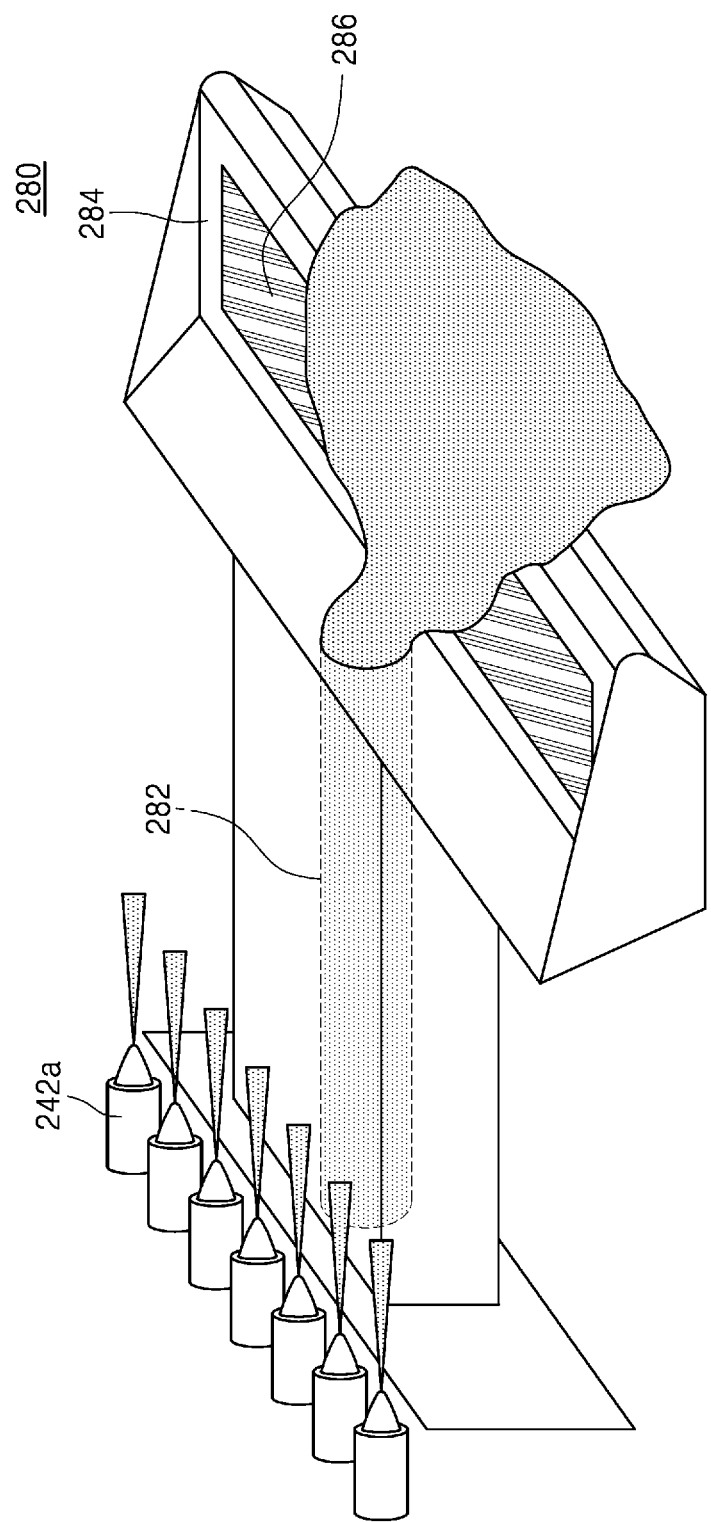
Figure 8E:
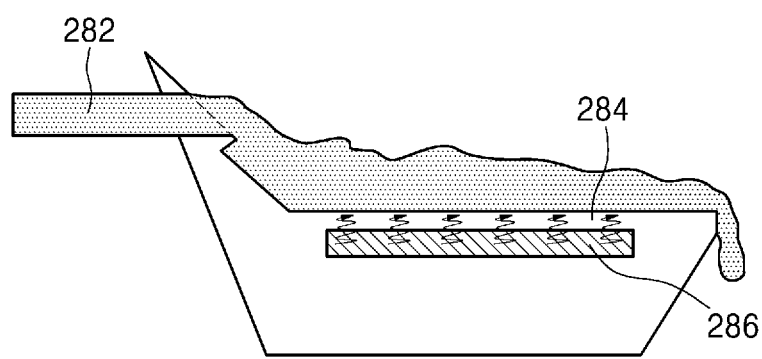

Referring to FIGS. 8D and 8E, in an embodiment, the first megasonic cleaner 280 and the second megasonic cleaner 290 are respectively mounted on the first inner wall 210a and the second inner wall 210b. Each of the first megasonic cleaner 280 and the second megasonic cleaner 290 includes the pipe 282, the fluid receiving portion 284, and the vibrating pad 286. The pipe 282 supplies a cleaning solution to the fluid receiving portion 284. Not only the fluid discharged from the pipe 282, but also cleaning solutions that have been sprayed from the first nozzles 242a, the second nozzles 242b, and the third nozzle 242c to the wafer W and then splattered from the wafer W can be accommodated in the fluid receiving portion 284. The vibrating pad 286 is disposed on the bottom of the fluid receiving portion 284. The vibrating pad 286 transmits energy to fluid accommodated in the fluid receiving portion 284 as waves. The first megasonic cleaner 280 and the second megasonic cleaner 290 clean the wafer W by transmitting energy to the fluid accommodated in the fluid receiving portion 284 as waves.

Figure 8F:
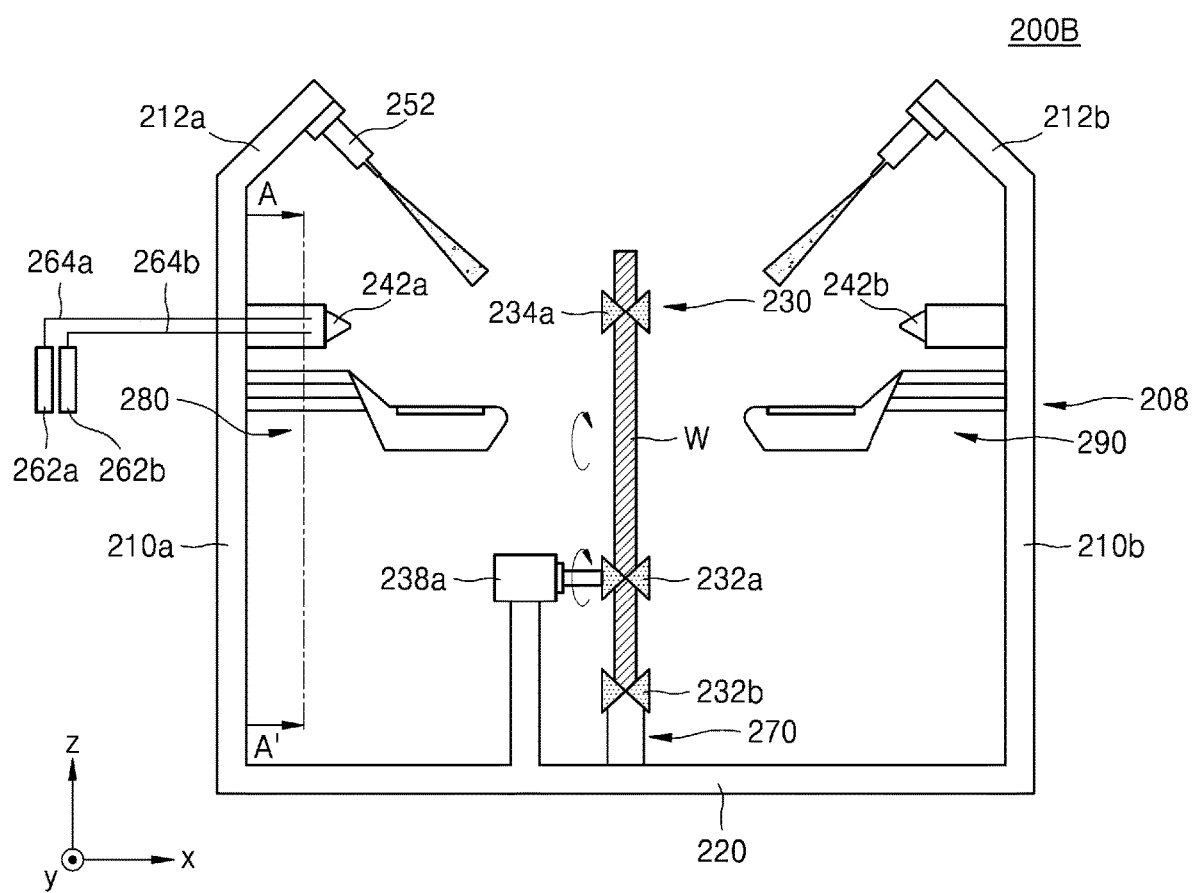
Figure 8G:
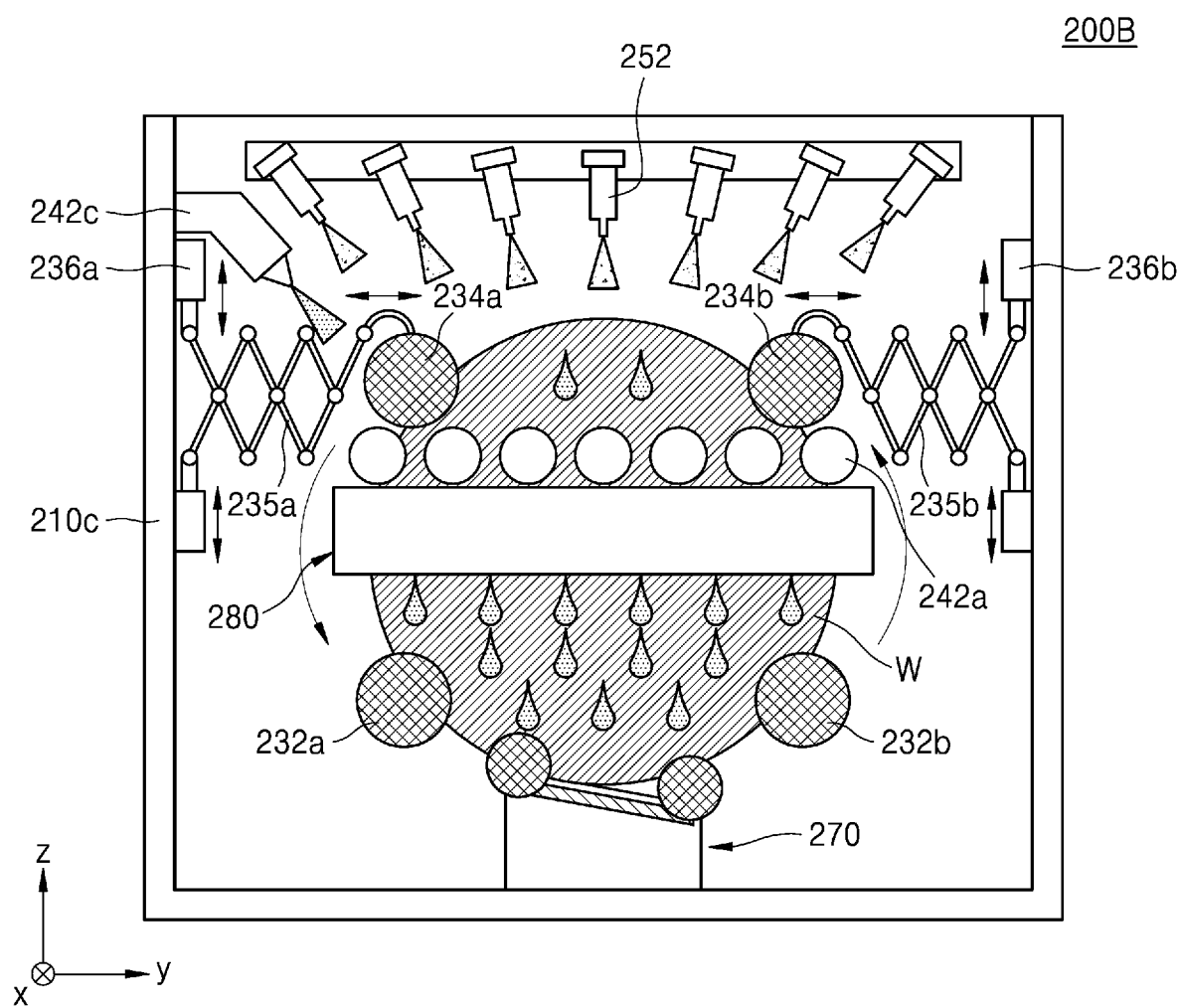

Referring to FIGS. 8F and 8G, in an embodiment, when a cleaning process that uses the first nozzles 242a, the second nozzles 242b, and the megasonic cleaner 270 is completed, a cleaning process using the rinse nozzles 252 is performed. In a cleaning process that uses the rinse nozzles 252, the wafer W is cleaned by using deionized water. The rinse nozzles 252 are aimed at the wafer W and may have different angles with respect to a plane formed by the Z-axis and the X-axis.

While embodiments of the inventive concept have been particularly shown and described with reference to the drawings, it will be understood that various changes in form and details may be made therein without departing from the spirit and scope of the following claims.

What is claimed is:

1. A wafer cleaning equipment, comprising:
    a vessel that includes a first inner wall, a second inner wall that faces the first inner wall, and a bottom connected to the first and second inner walls;
    a plurality of first nozzles disposed on the first inner wall;
    a plurality of second nozzles disposed on the second inner wall;
    a support structure disposed between the plurality of first nozzles and the plurality of second nozzles, wherein the support structure is configured to support a wafer; and
    a megasonic cleaner disposed between the bottom of the vessel and the wafer supported by the support structure,
    wherein the megasonic cleaner includes a rack and at least one vibrator disposed under the rack and configured to transmit energy to a cleaning solution accommodated in the rack as waves.

2. The wafer cleaning equipment of claim 1, wherein the rack is configured to accommodate the cleaning solution discharged from the plurality of first nozzles and the plurality of second nozzles.

3. The wafer cleaning equipment of claim 1, wherein the rack is inclined at a predetermined angle with respect to a virtual plane parallel with the bottom of the vessel.

4. The wafer cleaning equipment of claim 1, wherein the plurality of first nozzles are aimed at a main surface of the wafer.

5. The wafer cleaning equipment of claim 1, wherein the plurality of second nozzles are aimed at a bottom surface of the wafer.

6. The wafer cleaning equipment of claim 1, wherein the plurality of first nozzles and the plurality of second nozzles are symmetrically disposed with respect to the wafer.

7. The wafer cleaning equipment of claim 1, wherein the support structure includes:
    a plurality of lower supports coupled to a lower portion of the wafer and configured to support the wafer; and
    a plurality of upper supports coupled to an upper portion of the wafer and configured to integrally rotate with the wafer.

8. The wafer cleaning equipment of claim 7, further comprising a motor,
    wherein the plurality of lower supports are connected to the motor and are further configured to rotate the wafer.

9. The wafer cleaning equipment of claim 7, further comprising a plurality of arms configured to move in a direction parallel with the bottom of the vessel and in a direction perpendicular to the bottom of the vessel,
    wherein the plurality of upper supports are respectively connected to the plurality of arms.

10. The wafer cleaning equipment of claim 1, wherein the rack is disposed under the wafer supported by the support structure and inclined at a predetermined angle with respect to a virtual plane parallel with the bottom of the vessel.

11. A wafer cleaning equipment, comprising:
    a vessel that includes a first inner wall, a second inner wall that faces the first inner wall, and a bottom connected to the first and second inner walls;
    a first megasonic cleaner disposed on the first inner wall;
    a second megasonic cleaner disposed on the second inner wall;
    a plurality of first nozzles disposed on the first inner wall and above the first megasonic cleaner;
    a plurality of second nozzles disposed on the second inner wall and above the second megasonic cleaner;
    a support structure disposed between the plurality of first nozzles and the plurality of second nozzles, wherein the support structure is configured to support a wafer; and
    a third megasonic cleaner disposed between the bottom of the vessel and the wafer supported by the support structure,
    wherein the third megasonic cleaner includes a rack and at least one vibrator disposed under the rack and configured to transmit energy to a cleaning solution accommodated in the rack as waves.

12. The wafer cleaning equipment of claim 11, wherein each of the first megasonic cleaner and the second megasonic cleaner includes:
    a pipe that supplies a cleaning solution;
    a fluid receiving portion configured to accommodate the cleaning solution discharged from the pipe; and
    a vibrating pad disposed on a bottom of the fluid receiving portion.

13. The wafer cleaning equipment of claim 12, wherein the vibrating pad is configured to transmit energy to the cleaning solution accommodated in the fluid receiving portion as waves.

14. The wafer cleaning equipment of claim 11, further comprising:
    a third inner wall perpendicularly connected to the first and second inner walls; and
    a third nozzle disposed on the third inner wall,
    wherein the third nozzle is aimed at a side surface of the wafer.

15. The wafer cleaning equipment of claim 14, wherein the third nozzle is configured to spray fluid in a direction that does not disturb rotation of the wafer.

16. The wafer cleaning equipment of claim 11, wherein the plurality of first nozzles are aimed at a main surface of the wafer.

17. The wafer cleaning equipment of claim 11, wherein the plurality of second nozzles are aimed at a bottom surface of the wafer.

18. The wafer cleaning equipment of claim 11, wherein the plurality of first nozzles and the plurality of second nozzles are symmetrically disposed with respect to the wafer.

19. A wafer cleaning equipment, comprising:
- a vessel that includes a first inner wall, a second inner wall that faces the first inner wall, and a bottom connected to the first and second inner walls;
- a plurality of first nozzles disposed on the first inner wall, wherein the plurality of first nozzles are aimed at a main surface of a wafer;
- a plurality of second nozzles disposed on the second inner wall, wherein the plurality of second nozzles are aimed at a bottom surface of the wafer and are symmetrically disposed with the plurality of first nozzles with respect to the wafer;
- a support structure disposed between the plurality of first nozzles and the plurality of second nozzles, wherein the support structure is configured to support the wafer; and
- a megasonic cleaner disposed between the bottom of the vessel and the wafer supported by the support structure, wherein the megasonic cleaner includes a rack and at least one vibrator disposed under the rack, wherein the rack is inclined at a predetermined angle with respect to a virtual plane parallel with the bottom of the vessel, and the at least one vibrator transmits energy to a cleaning solution flowing on a top surface of the rack as waves, and the support structure includes:
- a plurality of lower supports coupled to a lower portion of the wafer and configured to support the wafer, wherein each of the plurality of lower supports is connected to a motor and is configured to rotate the wafer; and
- a plurality of upper supports coupled to an upper portion of the wafer and configured to integrally rotate with the wafer, wherein the plurality of upper supports are respectively connected to a plurality of arms configured to move in a direction parallel with the bottom of the vessel and in a direction perpendicular to the bottom of the vessel.

20. The wafer cleaning equipment of claim 19, further comprising:
- a third inner wall perpendicularly connected to the first and second inner walls; and
- a third nozzle disposed on the third inner wall,
- wherein the third nozzle is aimed at a side surface of the wafer and is configured to spray fluid to the side surface of the wafer.

* * * * *